(12) United States Patent
Peng et al.

(10) Patent No.: US 10,204,688 B2
(45) Date of Patent: Feb. 12, 2019

(54) MEMORY ARRAY, AND METHOD FOR READING, PROGRAMMING AND ERASING MEMORY ARRAY

(71) Applicants: Semiconductor Manufacturing International (Shanghai) Corporation, Shanghai (CN); Semiconductor Manufacturing International (Beijing) Corporation, Beijing (CN)

(72) Inventors: Jia Xu Peng, Shanghai (CN); Hao Ni, Shanghai (CN); Tian Shen Tang, Shanghai (CN); Yao Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/679,412

(22) Filed: Aug. 17, 2017

(65) Prior Publication Data

US 2018/0061502 A1 Mar. 1, 2018

(30) Foreign Application Priority Data

Aug. 31, 2016 (CN) .......................... 2016 1 0788897

(51) Int. Cl.
*G11C 16/04* (2006.01)
*G11C 16/34* (2006.01)
(Continued)

(52) U.S. Cl.
CPC ...... *G11C 16/3409* (2013.01); *G11C 11/5635* (2013.01); *G11C 13/0069* (2013.01);
(Continued)

(58) Field of Classification Search
CPC ............ G11C 16/3409; G11C 11/5635; G11C 13/0069; G11C 16/0433; G11C 16/0483; G11C 16/16; G11C 16/30; G11C 16/3413
(Continued)

(56) References Cited

U.S. PATENT DOCUMENTS 5,418,742 A * 5/1995 Asano .................... G11C 16/10
257/E27.103
5,953,250 A 9/1999 Hsu et al.
2013/0223148 A1 8/2013 Seo et al.

OTHER PUBLICATIONS

The European Patent Office (EPO) The Extended European Search Report for 17186992.8 dated Jan. 24, 2018 8 Pages.

* cited by examiner

*Primary Examiner* — Huan Hoang
(74) *Attorney, Agent, or Firm* — Anova Law Group, PLLC

(57) ABSTRACT

Memory arrays and reading, programming and erasing methods of the memory arrays are provided. An exemplary memory array includes a plurality of memory columns. Each memory column has a plurality of flash memory cells. The memory columns are divided into at least two blocks. At least one source pull down column is disposed between the two adjacent blocks. Each source pull down column has a plurality of flash memory cells. A source of each flash memory cell in the source pull down column is coupled to sources of the flash memory cells of the plurality memory columns in a same row as the flash memory cell in the source pull down column to pull down a source of a selected flash memory cell to 0 V.

20 Claims, 4 Drawing Sheets

(51) Int. Cl.
  *G11C 11/56*   (2006.01)
  *G11C 13/00*   (2006.01)
  *G11C 16/16*   (2006.01)
  *G11C 16/30*   (2006.01)
  *G11C 16/10*   (2006.01)
  *G11C 16/26*   (2006.01)

(52) U.S. Cl.
  CPC ...... *G11C 16/0433* (2013.01); *G11C 16/0483* (2013.01); *G11C 16/16* (2013.01); *G11C 16/30* (2013.01); *G11C 16/3413* (2013.01); *G11C 16/10* (2013.01); *G11C 16/26* (2013.01)

(58) Field of Classification Search
  USPC ..................................................... 365/185.33
  See application file for complete search history.

MEMORY ARRAY, AND METHOD FOR READING, PROGRAMMING AND ERASING MEMORY ARRAY

CROSS-REFERENCES TO RELATED APPLICATIONS

This application claims the priority of Chinese patent application No. 201610788897.8, filed on Aug. 31, 2016, the entirety of which is incorporated herein by reference.

FIELD OF THE DISCLOSURE

The present disclosure generally relates to the field of memory and, more particularly, relates to memory arrays, and reading, programming and erasing methods thereof.

BACKGROUND

Flash memory is a type of long life span, non-volatile memory. The flash memory may maintain stored data information, even when the power is off. As such, the flash memory is often used to store configuration information. For example, data may be stored in the basic input output system (BIOS) of personal computers, personal digital assistant (PDA), and digital cameras, etc.

FIG. 1 shows a circuit diagram of an existing memory array 100. As shown in FIG. 1, taking a 4-row and 192-column memory array as an example, the memory array 100 includes a plurality of memory columns. The memory cells in the memory columns are flash memory cells. The drains of the memory cells in each columns of the memory array 100 are coupled to the bit lines corresponding to the memory columns, such as the bit lines b1<0>, b1<1> ... b1<190>, and b1<191> illustrated in FIG. 1. The control gates of the $m^{th}$ rows of flash memory cells in the plurality of memory columns are coupled to the control gates of the $(m+1)^{th}$ rows of flash memory cells in the plurality of memory columns; and coupled to the corresponding control gate lines, such as control gate lines cg<0> and cg<1> illustrated in FIG. 1. The sources of the $m^{th}$ rows of flash memory cells in the plurality of memory columns and the sources of the $(m+1)^{th}$ rows of flash memory cells in the plurality of memory columns are configured to receive the source line signals, such as source line signals sl<0> and sl<1> illustrated in FIG. 1. Further, the select gates of the flash memory cells in a same row of memory cells in the plurality of memory columns are respectively coupled to a same work line, such as work lines wl<0>, wl<1>, wl<2> and wl<3>, where m≥1; and m is an odd number.

During the reading operation of the memory array 100, the source of a to-be-read flash memory cell 10 in the memory array 100 needs to be pulled down to a potential of 0 V. The existing technologies often utilize relatively large pull down devices, such as NMOS transistors including the pull down devices 20, 30, 40, and 50, to couple the source of the to-be-read flash memory cell 10. Further, the pull down signal slpd<0> turns on the pull down devices 20 and 30 to pull down the source of the to-be-read flash memory cell 10 to ground, i.e., a potential of 0 V relative to the ground. If the to-be-read flash memory cell is in the third row or the fourth row of the memory array 100, the pull down devices 40 and 50 are turned on by the pull down signal slpd<1> to pull down the source of the to-be-read flash memory 10.

However, the paths between the source of the to-be-read flash memory cell 10 in the memory cell array 100 and the pull down devices have certain impedances. Specifically, the paths have metal resistors and diffusion resistors. Thus, in reality, the potential of the source of the to-be-read flash memory is not 0 V. Such a condition significantly affects the reading performance of the to-be-read flash memory cell 10. Especially when the number of the columns in the memory array 100 is relatively large, the impedance issue is more severe; and the reading performance of the flash memory cell is worse.

FIG. 2 illustrates a schematic of the equivalent resistors between the to-be-read flash memory cell 10 and the pull down devices in the existing memory array 100. As shown in FIG. 2, the source of the to-be read flash memory cell 10 outputs a source current $I_{s1}$. The paths for the source current $I_{s1}$ flowing into the pull down device 20 and the pull down device 30 can be equivalent to metal resistors RM_L, RM_M and RM_R, and diffusion resistors Rdiff_L and Rdiff_R. The existing technologies often connect the metal resistors and the diffusion resistors with the other resistors in parallel to reduce the resistances of the metal resistors and the diffusion resistors in the circuit. Specifically, as shown in FIG. 2, the resistors R1, R2, R3 and R4 are connected in the circuit. Connecting the resistors in parallel is able to reduce the resistances of the metal resistors and the diffusion resistors in the circuit to a certain extent; and cause the potential of the sources of the flash memory cell 10 to be closer to 0 V to improve the reading performance of the flash memory cell 10. However, the improvement of the reading performance of the flash memory cell 10 has a certain limitation. Further, extra mask areas are needed in the circuit design; and the power consumption of the memory array 100 is increased.

Therefore, the existing memory arrays still have the reading performance issues. The disclosed memory array structures, and memory reading, programming and erasing methods are directed to solve one or more problems set forth above and other problems in the art.

BRIEF SUMMARY OF THE DISCLOSURE

One aspect of the present disclosure includes a memory array. The memory array includes a plurality of memory columns. Each memory column has a plurality of flash memory cells, and the memory columns are divided into at least two blocks. At least one source pull down column is disposed between two adjacent blocks; and each source pull down column has a plurality of flash memory cells. A select gate of each flash memory cell in the source pull down column and select gates of the corresponding flash memory cells of the plurality of memory columns in a same row are coupled to a same word line; a control gate of each flash memory cell in the source pull down column and control gates of the corresponding flash memory cells of the plurality of memory columns in a same row are coupled to a same control gate line; an erasing gate of each flash memory cell in the source pull down column and erasing gates of the corresponding flash memory cells of the plurality of memory columns in a same row are coupled to a same erasing gate line; and a source of each flash memory cell in the source pull down column is coupled to sources of the corresponding flash memory cells of the plurality of memory columns in a same row; and a drain of each flash memory cell in the source pull down column is configured to receive a source pull down control signal.

Another aspect of the present disclosure includes a method for reading a memory array. The method includes providing a memory array having a plurality of memory columns. Each memory column has a plurality of flash memory cells; and the memory columns are divided into at least two blocks. At least one source pull down column is disposed between the two adjacent blocks; and each source pull down column has a plurality of flash memory cells. A select gate of each flash memory cell in the source pull down column and select gates of the corresponding flash memory cells of the plurality of memory columns in a same row are coupled to a same word line. A control gate of each flash memory cell in the source pull down column and control gates of the corresponding flash memory cells of the plurality of memory columns in a same row are coupled to a same control gate line. An erasing gate of each flash memory cell in the source pull down column and erasing gates of the corresponding flash memory cells of the plurality of memory columns in a same row are coupled to a same erasing gate line. A source of each flash memory cell in the source pull down column are coupled to sources of the corresponding flash memory cells of the plurality of memory columns in a same row. A drain of each flash memory cell in the source pull down column is configured to receive a source pull down control signal. The method also includes controlling the source pull down control signal to be approximately 0 V; and setting voltages of the word line, the bit line, the control gate line and the erasing gate line coupled to a selected flash memory cell to cause the selected flash memory cell to be read.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides memory arrays and reading, programming and erasing methods of the memory array.

The memory array may include a plurality of memory columns. The plurality of memory columns may be divided into at least two blocks; and at least one source pull down column may be disposed between two adjacent blocks. The source pull down column may include a plurality of flash memory cells. The select gate of each flash memory cell in the source pull down column and the select gates of the corresponding flash memory cells of the plurality of memory columns in a same row may be coupled to a same word line. The control gate of each flash memory cell in the source pull down column and the control gate of the corresponding flash memory cells of the plurality of memory columns in a same row may be coupled to a same control gate line. The erasing gate of each flash memory cell in the source pull down column and the corresponding erasing gates of the flash memory cells in the plurality of memory columns in a same row may be coupled to a same erasing gate line. The source of each flash memory cell in the source pull down column may be coupled to the sources of the corresponding flash memory cells in the plurality of memory columns in a same row. The drain of each flash memory cell in the source pull down column may be configured to receive the pull down control signal. By the controlling of the pull down control signal, the pull down path of the source of a selected (to-be-read) flash memory cell in the memory array may be reduced. Thus, the reading performance of the flash memory cell may be improved; and the circuit design may be easier to realize. Further, the mask area for fabricating the flash memory array may be saved.

Figure 1:
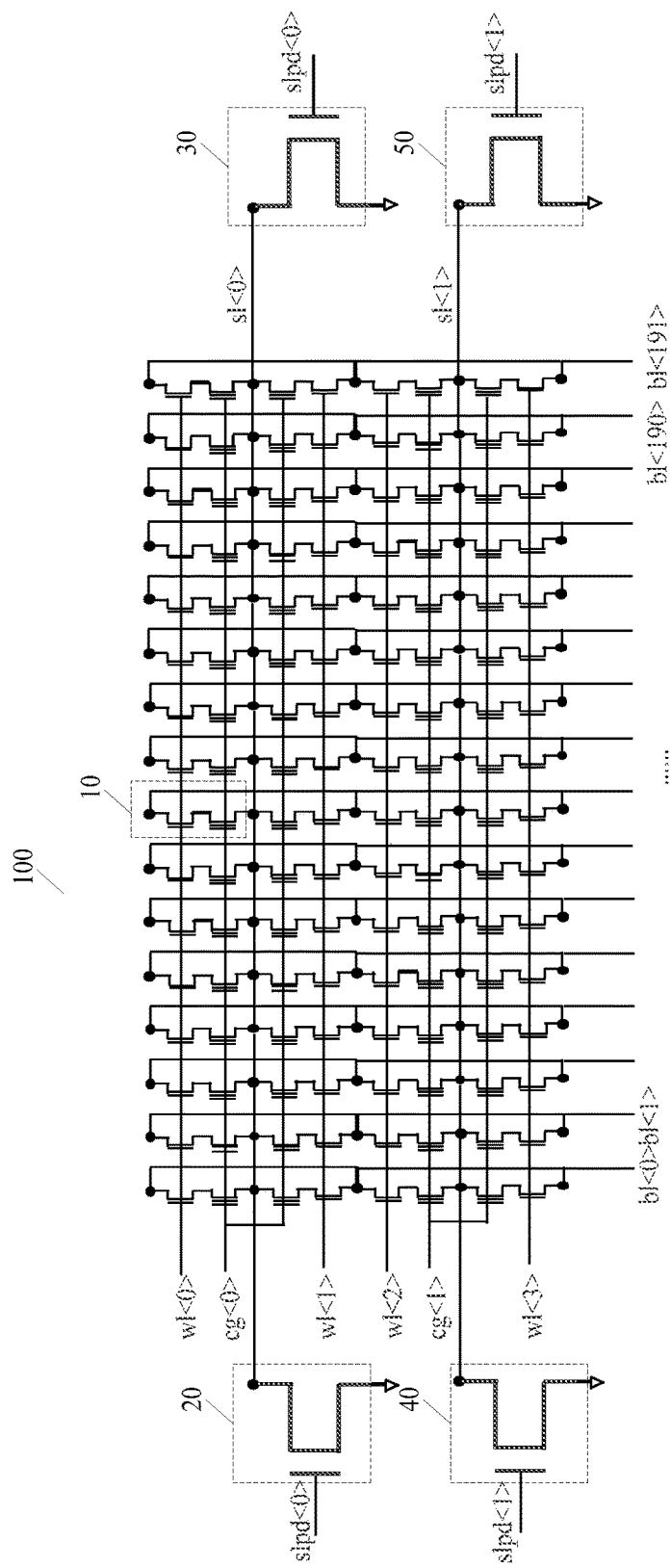
FIG. 1 illustrates a circuit diagram of an existing memory array.
Figure 2:
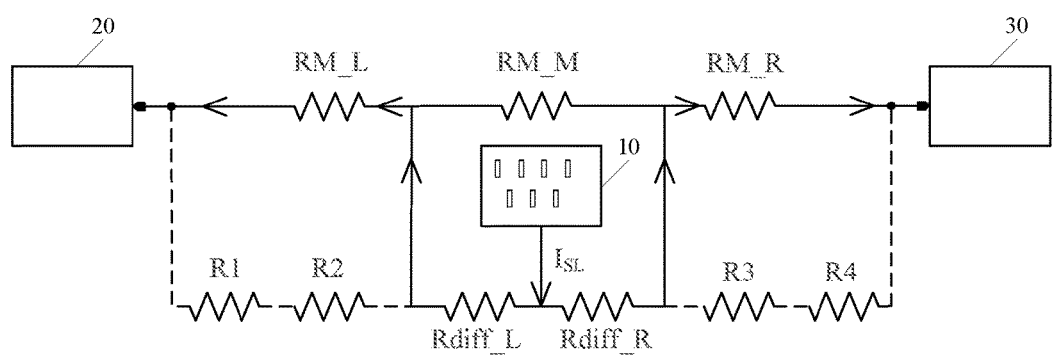
FIG. 2 illustrates a schematic of equivalent resistors of the paths between the source of the selected flash memory and the pull down devices in the existing memory array 100 illustrated in FIG. 1.
Figure 3:
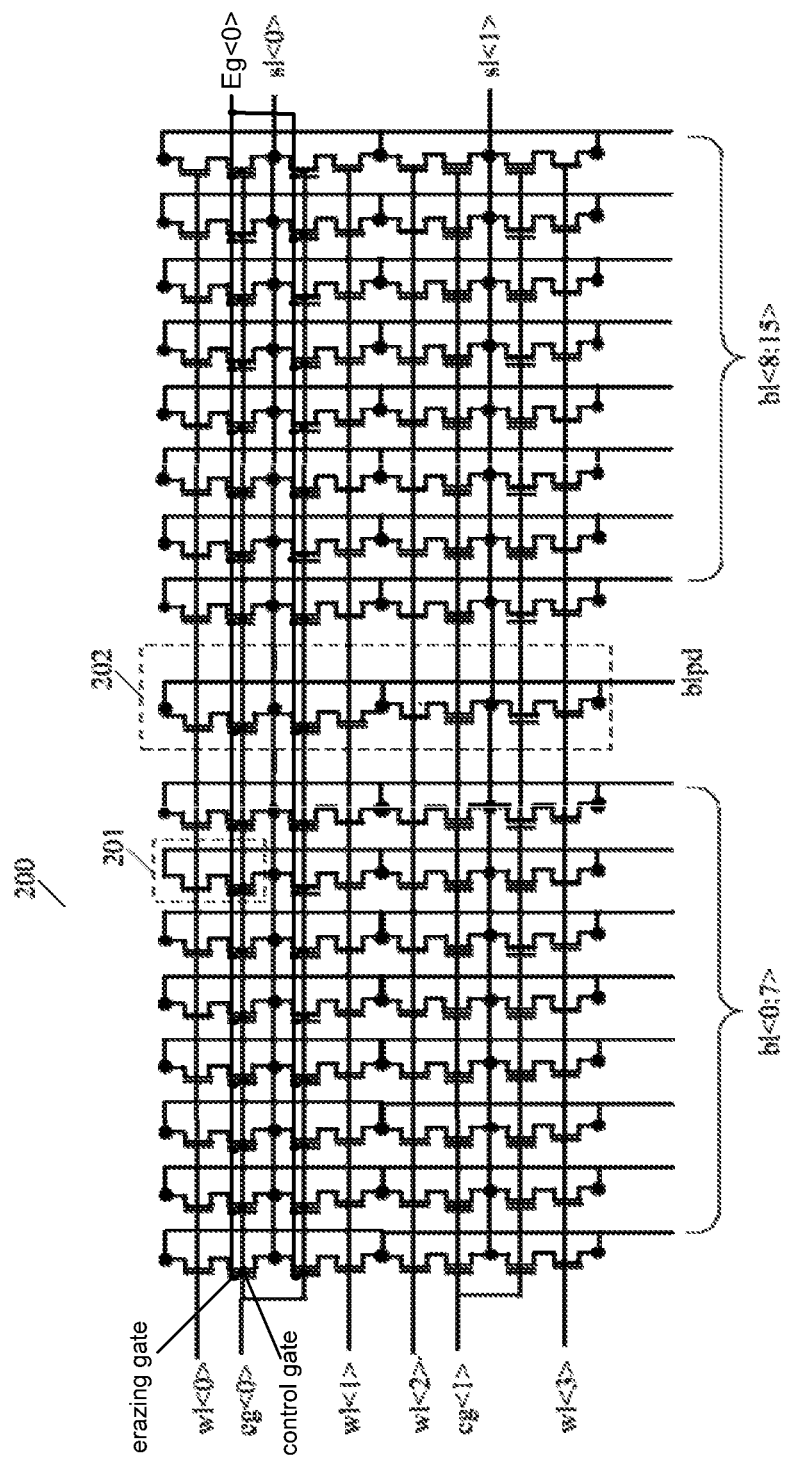
FIG. 3 illustrates a circuit diagram of an exemplary memory array consistent with the disclosed embodiments.

FIG. 3 illustrates a circuit diagram of an exemplary memory array 200 consistent with the disclosed embodiments. As shown in FIG. 3, the memory array 200 may include a plurality of memory columns. Each memory column may include a plurality of flash memory cells.

For illustrative purposes, the memory array 200 includes 4 rows and 16 columns. In some embodiments, the memory array may have any other appropriate size; and the size of the memory array is not limited.

The plurality of memory columns may be divided into at least two blocks. A source pull down column 202 may be disposed between two adjacent blocks. The source pull down column 202 may have a plurality of flash memory cells.

The select gate of each flash memory cell in the source pull down column 202 and the select gates of the corresponding flash memory cells in the plurality of memory columns in a same row as the flash memory cell in the source pull down column 202 may be coupled to a same word line, such as the word lines w1<0>, wl<1>, w1<2> and w1<3> illustrated in FIG. 3. The control gate of each flash memory cell in the source pull down column 202 and the control gates of the corresponding flash memory cells of the plurality of the memory columns in a same row as the flash memory cell in the source pull down column 202 may be coupled to a same control gate line, such as the control gate lines cg<0> and cg<1> illustrated in FIG. 3. The erasing gate of each flash memory cell in the source pull down column 202 and the erasing gates of the corresponding flash memory cells of the plurality of the memory columns in a same row as the flash memory cell in the source pull down column 202 may be coupled to a same erasing gate line eg<0>.

The source of each flash memory cell in the source pull down column 202 may be coupled to the sources of the corresponding flash memory cells of the plurality of the memory columns in a same row as the flash memory cell in the source pull down column 202. The drain of each flash memory cell in the source pull down column 202 may be configured to receive a pull down control signal of a selected (to-be-read memory cell) 201.

The flash memory cells may be any appropriate type. In one embodiment, the flash memory cells are stacked gate flash memory cells.

In one embodiment, the pull down control signal may be generated by a coding circuit (not shown). The coding source and the coding methods are not limited. Different pull down control signals may be obtained by coding processes according to the operation requirements of the memory array 200, such as reading, programming, and erasing, etc.

In the disclosed embodiments, the source pull down column 202 may be disposed between adjacent blocks of the memory array 200. During the reading operation, the pull down signal "blpd" may be controlled as 0 V. Further, the configurations of the word lines, control gate lines and erasing lines of a selected (to-be-read) flash memory cell 201 in the memory array 200 may turn on the source and the drain of a corresponding flash memory cell in the source pull down column 202 in a same row. When the pull down control signal is 0 V, the source of the selected flash memory 201 may be pulled down to a zero potential by the source pull down column to cooperate with the reading operation of the selected flash memory 201.

Because at least one pull down column may be disposed between adjacent blocks, the memory array 200 may have a plurality of source pull down columns 202. Comparing with the existing technologies, the memory array 200 may be able to reduce the pulled down paths of the source of the selected flash memory cell 201 by controlling the pull down control signal "blpd". Accordingly, the metal resistance and the diffusion resistance in the pulled down paths of the source of the selected flash memory cell 201 may be reduced. Therefore, comparing with the existing technologies, the real potential of the source of the selected flash memory cell 201 may be closer to 0 V. Accordingly, the reading performance of the memory array 200 may be improved.

In one embodiment, the number of the memory columns may be a positive integral time of 8 (e.g., 8n, where n is a positive integer). For example, the memory array may include 192 memory columns. The number of the memory columns of the memory array is not limited.

When the memory array is divided into blocks, the number of the blocks in the memory array may be a positive integral time of power of 2 ($2^n$, where n is a positive integer). For example, the number of blocks in the memory array may be 2, 4, 8, 16, etc.

Specifically, in one embodiment, each block of the memory array 200 may include 8 memory columns; and 2 source pull down columns may be disposed between adjacent blocks. That is, in the memory array 200, 2 source pull down columns may be disposed between adjacent 8 memory columns.

The source pull down column 202 may be used to form an optimized pull down path for the source of the selected flash memory cell 201; and the source pull down column 202 may not be operated along with the selected flash memory cell 201. Thus, the insertion of the source pull down column 202 may separate the plurality of memory columns of the memory array 200.

In specific embodiments, a constant number of source pull down memory columns 202 may be inserted between adjacent memory columns according to a certain regularity to cause the operation of the memory array 200 inserted with the pull down memory columns 202 to have certain regularity and continuity. Accordingly, it may enable the design of the circuit and the controlling of the controllers to be convenient.

Further, when the memory array 200 is divided into blocks, the smaller the sizes of the blocks are, the closer the sources of the to-be-read flash memory 201 are pulled down to the ground through the source pull down columns 202. Accordingly, the equivalent resistance in the pull down paths may be smaller. The larger the number of the source pull down columns 202 is, the smaller of the diffusion resistances in the pull down paths are. That is, the smaller the size of the blocks is, the larger the number of the source pull down columns 202 inserted between the adjacent blocks is. Thus, the source of the selected flash memory cell 201 may be pulled down closer to the 0 V potential. Accordingly, the reading operation of the memory cell 200 may be better improved.

In some embodiments, the sizes of the blocks and the number of the source pull down columns 202 may be adjusted according to other factors, such as the area of the memory array 200, and the power of the memory array 200, etc.

Further, the source pull down column 202 may include a plurality of flash memory cells. The flash memory cells of the source pull down columns 202 may be identical to the flash memory cells of the memory columns. Thus, all the flash memory cells in the memory array 200 may be coherent; and such a design may be easy to realize. Further, when the memory array 200 is operated, it may only need to set the pull down control signal "blpd"; and the operation may be relatively simple.

Further, comparing with the existing technologies, the disclosed memory array 200 may not use relatively large size pull down devices; and may utilize the source pull down column 202 to pull down the source of the selected flash memory cell 201. Thus, the area of the mask for fabricating the memory array 200 may be significantly reduced.

Further, referring to FIG. 3, for illustrative purposes, the memory array 200 may have 4 columns and 16 columns. In specific embodiments, the size of the memory array may be expanded. In one embodiment, the drains of the flash memory cells in each column of the memory array 200 may be coupled to the corresponding bit lines, such as the bit lines bl<8:7> and bl<8:15> illustrated in FIG. 3. The control gates of the flash memory cells in the $m^{th}$ row of the plurality of memory columns may be mutually coupled to the control gates of the flash memory cells in the $(m+1)^{th}$ row of the plurality of memory columns, and together coupled to the corresponding control gate lines, such as the control gate lines cg<0> and cg<1> illustrated in FIG. 3. The erasing gates of the flash memory cells in the $m^{th}$ row of the plurality of memory columns may be mutually coupled to the erasing gates of the flash memory cells in the $(m+1)^{th}$ row of plurality of memory columns, and together coupled to the corresponding erasing gate lines eg<0>. The sources of the flash memory cells in the $m^{th}$ row of the plurality of memory columns and the sources of the flash memory cells in the $(m+1)^{th}$ row of plurality of memory columns may receive source line signals, such as the source line signals sl<0> and sl<1> illustrated in FIG. 3. Further, the select gates of the flash memory cells in a same row of the plurality of memory columns may be coupled to a same word line, such as the word lines wl<0>, wl<1>, wl<2> and wl<3>, where m≥1; and m is an odd number.

The memory array 200 inserted with the source pull down column 202 may be operated by controlling the pull down control signal "blpd" according to different operation modes.

Figure 4:
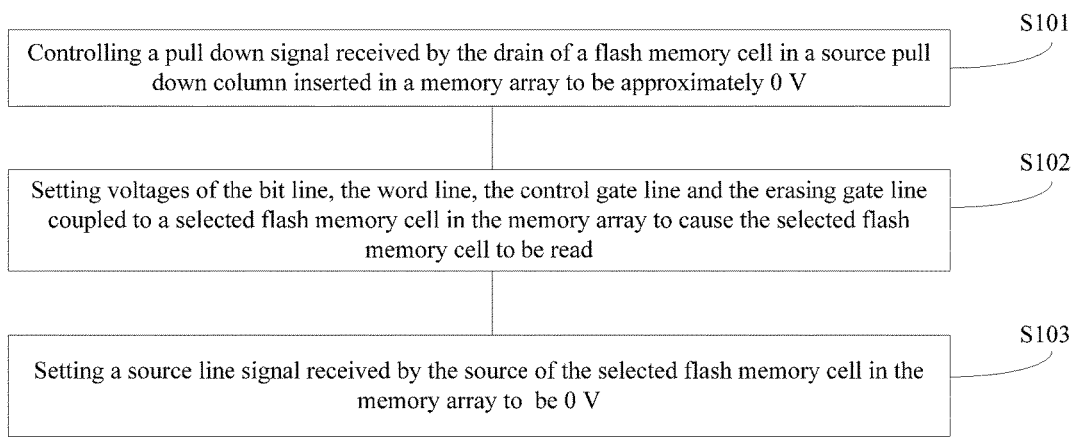
FIG. 4 illustrates an exemplary memory array reading method consistent with the disclosed embodiments.

FIG. 4 illustrates an exemplary reading method of a memory array consistent with the disclosed embodiments. The reading method may be used to perform a reading operation to the memory array 200 illustrated in FIG. 3, or other appropriate memory arrays. For illustrative purposes, the reading operation of the memory array 200 is described.

As shown in FIGS. 3-4, the reading method may include controlling the pull down signal "blpd" to be 0 V (S101). Further, the reading method may include setting the voltages of the bit line, the word line, the control gate line and the erasing gate line coupled to a selected flash memory cell to cause the selected flash memory cell, such as the flash memory cell 201, to be read (S102). Under such a condition, the flash memory cell of the source pull down column 202 in a same row as the selected flash memory cell 201 may be turned on. Turning on such a flash memory cell may aid to pull down the source of the selected flash memory cell 201 to be 0 V potential.

Specifically, setting the voltages of the bit line, the word line, the control gate line and the erasing gate line coupled to the selected flash memory cell 201 may include applying a first voltage to the bit line coupled to the selected flash memory cell 201; applying a second voltage to the word line coupled to the selected flash memory cell 201; applying a third voltage to the control gate line coupled to the selected flash memory cell 201; and applying a fourth voltage to the erasing gate line coupled to the selected flash memory cell 201.

The first voltage may be in range of approximately 0.5 V-1.0 V. In one embodiment, the first voltage is approximately 0.7 V. The second voltage may be in a range of approximately 2.0 V-3.0 V. In one embodiment, the second voltage is approximately 2.5 V. The third voltage may be in a range of approximately 2.0 V-3.0 V. In one embodiment, the third voltage is approximately 2.5 V. The fourth voltage may be approximately 0 V.

Further, in one embodiment, the reading method may also include setting the source line signal s1<0> as 0V (the source line signal received by the source of the flash memory cell 201 is sl<0>) (S103). The source line signal sl<0> may be obtained by decoding the operation mode of the memory array 200. The source line signal sl<0> may also be obtained by pulled down the source line signal sl<0> to ground by a relatively small pull down device.

The present disclosure also provides a programming method of a memory array. The programming method may be used to perform a programming operation to the memory array 200 illustrated in FIG. 3, or other appropriate memory arrays. For illustrative purposes, the programming operation of the memory array 200 is described herein.

Referring to FIG. 3, the programming method may include setting the voltages of the bit line, the word line, the control gate line and the erasing gate line coupled to a certain selected (to-be-read) flash memory cell to cause the certain flash memory cell, such as the flash memory cell 201, to be programmed; and controlling the pull down control signal "blpd" to cause the flash memory cells of the pull down column 202 not to be programmed.

Specifically, controlling the pull down control signal "blpd" may include controlling the pull down control signal "blpd" to be in a range approximately 2 V-3 V. Setting the voltages of the bit line, the word line, the control gate line and the erasing gate line coupled to the selected flash memory cell 201 may include applying a voltage in a range of approximately 0.1 V-0.5 V to the bit line coupled to the selected memory cell 201; applying a voltage in a range of approximately 0.8 V-1.2 V to the word line coupled to the selected flash memory cell 201; applying a voltage in a range of approximately 10 V-11 V to the control gate line coupled to the selected flash memory cell 201; and applying a voltage in a range of approximately 4 V-5 V to the erasing gate line coupled to the selected flash memory cell 201.

In one embodiment, the pull down control signal may be controlled as approximately 2.5 V. The voltage applied to the bit line coupled to the selected flash memory cell 201 is approximately 0.3 V; the voltage applied to the word line coupled to the selected flash memory cell 201 is approximately 1 V; the voltage applied to the control gate line coupled to the selected flash memory cell 201 is in a range of approximately 10.5 V; and the voltage applied to the erasing gate line coupled to the selected flash memory 201 is approximately 4.5 V.

Further, in one embodiment, the programming method may also include setting source line signal s1<0> as approximately 2.5 V. The source line signal sl<0> may be obtained by decoding the operation modes of the memory array 200.

The present disclosure also provides an erasing method of a memory array. The erasing method may be used to perform an erasing operation to the memory array 200 illustrated in FIG. 3, or other appropriate memory arrays. For illustrative purposes, the erasing operation of the memory array 200 is described.

Referring to FIG. 3, the erasing method may include setting the voltages of the bit line, the word line, the control gate line and the erasing gate line coupled to a certain selected (to-be-read) flash memory cell to cause the certain flash memory cell, such as the flash memory cell 201, to be erased; and also setting the pull down control signal "blpd" to cause the flash memory cells of the pull down column 202 to be erased.

Specifically, setting the pull down control signal "blpd" may include controlling the pull down control signal "blpd" to be approximately 0 V. Setting the voltages of the bit line, the word line, the control gate line and the erasing gate line coupled to the selected flash memory cell 201 may include applying a voltage of approximately 0 V to the bit line coupled to the selected flash memory cell 201; applying a voltage of 0 V to the word line coupled to the selected flash memory cell 201; applying a voltage approximately 0 V to the control gate line coupled to the selected flash memory cell 201; and applying a voltage in a range of approximately 11 V-12 V to the erasing gate line coupled to the selected flash memory cell 201.

In one embodiment, the pull down control signal may be controlled as approximately 0 V. The voltage applied to the bit line coupled to the selected flash memory cell 201 is approximately 0 V; the voltage applied to the word line coupled to the selected flash memory cell 201 is approximately 0 V; the voltage applied to the control gate line coupled to the selected flash memory cell 201 is approximately 0 V; and the voltage applied to the erasing gate line coupled to the t selected flash memory cell 201 is approximately 11.5 V.

Further, in one embodiment, the programming method may also include setting source line signal s1<0> as approximately 0 V. The source line signal sl<0> may be obtained by decoding the operation modes of the memory array 200. The source line signal sl<0> may also be obtained by pulled down the source line signal sl<0> to ground by a relatively small pull down device.

In the disclosed embodiments, the reading, programming and erasing methods of the memory array 200, the sequences for setting the voltages of the bit lines, the word lines, the control gate lines and the erasing lines of the flash memory cells in the memory array 200 may not be limited.

Further, the voltages applied to each terminals of the flash memory cells are referred to the voltages relative to the ground of the memory array 200.

Therefore, when the disclosed memory array is performing a reading operation, the pull down control signal may be controlled to be 0 V. Further, the voltage setups of the word line, the control gate line, and the control gate line of the selected (to-be-read) flash memory cell may turn on the source-drain of a flash memory cell of the source pull down memory column in a same row as the selected flash memory cell. Thus, when the pull down control signal is controlled to be 0 V, the source of the flash memory cell in the source pull down memory column may be pulled to a zero potential to cooperate of the reading operation of the selected flash memory cell. Because at least one source pull down column may be disposed between adjacent blocks, the memory array may have a plurality of source pull down columns. Thus, comparing with the existing technologies, the disclosed memory array may reduce the pulled down path of the source of the selected flash memory cell by controlling the source pull down signal. Accordingly, the metal resistance and the diffusion resistance in the pulled down path of the selected flash memory cell may be reduced. Therefore, comparing with the existing technologies, the real potential of the source of the selected flash memory cell may be closer to 0 V. Accordingly, the reading performance of the memory array may be improved.

Further, the source pull down columns may include a plurality of flash memory cells. The flash memory cells of the source pull down columns may be identical to the flash memory cells of the memory column. Thus, all the flash memory cells in the memory array may be coherent; and such a design may be easy to realize. Further, when the memory array is operated, it may only need to set the pull down control signal; and the operation may be relatively simple.

Further, comparing with the existing technologies, the disclosed memory array may not use relatively large pull down devices; and may use the source pull down column to pull down the source of the selected flash memory cell. Thus, the area of the mask for forming the memory array may be significantly reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A memory array, comprising:
a plurality of memory columns, each memory column having a plurality of flash memory cells, the memory columns being divided into at least two blocks, wherein:
   at least one source pull down column is disposed between two adjacent blocks, and each source pull down column has a plurality of flash memory cells;
   a select gate of each flash memory cell in the source pull down column and select gates of corresponding flash memory cells of the plurality of memory columns in a same row are coupled to a same word line;
   a control gate of each flash memory cell in the source pull down column and control gates of corresponding flash memory cells of the plurality of memory columns in a same row are coupled to a same control gate line;
   an erasing gate of each flash memory cell in the source pull down column and erasing gates of corresponding flash memory cells of the plurality memory columns in a same row are coupled to a same erasing gate line;
   a source of each flash memory cell in the source pull down column is coupled to sources of corresponding flash memory cells of the plurality of memory columns in a same row; and
   a drain of each flash memory cell in the source pull down column is configured to receive a source pull down control signal.

2. The memory array according to claim 1, wherein:
drains of each column of flash memory cells are coupled to a word line corresponding to the column of flash memory cells;
control gates of an $m^{th}$ column of flash memory cells are mutually coupled with control gates of an $(m+1)^{th}$ column of flash memory cells and coupled to a corresponding control gate line;
   erasing gates of the $m^{th}$ column of flash memory cells are mutually coupled with erasing gates of the $(m+1)^{th}$ column of flash memory cells and coupled to a corresponding erasing gate line; and
   sources of the $m^{th}$ column of flash memory cells and sources of the $(m+1)^{th}$ column of flash memory cells are configured to received source line signals,
   wherein:
      $m \geq 1$; and
      m is an odd number.

3. The memory array according to claim 1, wherein:
a number of the plurality of memory columns is a positive integral time of 8.

4. The memory array according to claim 1, wherein:
a number of the memory columns in each block is a positive integral power of 2.

5. The memory array according to claim 4, wherein:
the number of the memory columns in each block is 8; and
two source pull down columns are disposed between two adjacent blocks.

6. The memory array according to claim 1, wherein:
the flash memory cells are stacked gate flash memory cells.

7. A memory array reading method, comprising:
providing a memory array having a plurality of memory columns, each memory column having a plurality of flash memory cells, the memory columns being divided into at least two blocks, at least one source pull down column being disposed between the two adjacent blocks, each source pull down column having a plurality of flash memory cells, a select gate of each flash memory cell in the source pull down column and select gates of the corresponding flash memory cells of the plurality memory columns in a same row being coupled to a same word line, a control gate of each flash memory cell in the source pull down column and control gates of the corresponding flash memory cells of the plurality memory columns in a same row being coupled to a same control gate line, an erasing gate of each flash memory cell in the source pull down column and erasing gates of the corresponding flash memory cells of the plurality memory columns in a same row being coupled to a same erasing gate line, a source of each flash memory cell in the source pull down column being coupled to sources of the corresponding flash memory cells of the plurality memory columns in a same row, and a drain of each flash memory cell in the source pull down column being configured to receive a source pull down control signal;
controlling the source pull down control signal to be approximately 0 V; and setting voltages of the word line, the bit line, the control gate line and the erasing gate line coupled to a selected flash memory cell to cause the selected flash memory cell to be read.

8. The method according to claim 7, wherein setting voltages of the word line, the bit line, the control gate line and the erasing gate line coupled to the selected flash memory cell comprises:
applying a first voltage to the bit line coupled to the selected flash memory cell;
applying a second voltage to the word line coupled to the selected flash memory cell;
applying a third voltage to the control gate line coupled to the selected flash memory cell; and
applying a fourth voltage to the erasing gate line coupled to the selected flash memory cell.

9. The method according to claim 8, wherein:
the first voltage is in a range of approximately 0.5 V-1 V;
the second voltage is in a range of approximately 2 V-3 V;
the third voltage is in a range of approximately 2 V-3 V; and
the fourth voltage is approximately 0 V.

10. The method according to claim 9, wherein:
the first voltage is approximately 0.7 V;
the second voltage is approximately 2.5 V; and
the third voltage is approximately 2.5 V.

11. The method according to claim 9, further comprising:
setting a source signal received by the source of the selected flash memory cell to be approximately 0 V.

12. The method according to claim 11, wherein setting the source signal received by the source of the selected flash memory cell to be approximately 0 V comprises:
obtaining the source signal by decoding an operation mode of the memory array.

13. The method according to claim 11, wherein setting the source signal received by the source of the selected flash memory cell to be approximately 0 V comprises:
pulling down the source of the selected flash memory cell by a relatively small pull down device.

14. A programming method of the memory array according to claim 1, the method comprising:
setting voltages of the pull down control signal, the word line, the bit line, the control gate line and the erasing gate line coupled to a selected flash memory cell to cause the selected flash memory cell to be programmed, and cause the flash memory cells of the pull down memory column not to be programmed.

15. The method according to claim 14, wherein setting voltages of the pull down control signal, the word line, the bit line, the control gate line and the erasing gate line comprises:
controlling the pull down control signal to be in a range of approximately 2 V-3 V;
applying a voltage in a range of approximately 0.1 V-0.5 V to the bit line coupled to the selected flash memory cell;
applying a voltage in a range of approximately 0.8 V-1.2 V to the word line coupled to the selected flash memory cell;
applying a voltage in a range of approximately 10 V-11 V to the control gate line coupled to the selected flash memory cell; and
applying a voltage in a range of approximately 4 V-5 V to the erasing gate line coupled to the selected flash memory cell.

16. The method according to claim 15, wherein:
the voltage applied to the pull down control signal is approximately 2.5 V;
the voltage applied to the bit line coupled to the selected flash memory cell is approximately 0.3 V;
the voltage applied to the word line coupled to the selected flash memory cell is approximately 1 V;
the voltage applied to the control gate line coupled to the selected flash memory cell is approximately 10.5 V; and
the voltage applied to the erasing gate line coupled to the selected flash memory cell is approximately 4.5 V.

17. The method according to claim 16, further comprising:
setting a source signal received by the source of the selected flash memory cell to be approximately 2.5 V.

18. An erasing method of the memory array according to claim 1, the method comprising:
setting voltages of the pull down control signal, the word line, the bit line, the control gate line and the erasing gate line coupled to a selected flash memory cell to cause the selected flash memory cell and the flash memory in the source pull down column all to be erased.

19. The method according to claim 18, wherein setting voltages of the pull down control signal, the word line, the bit line, the control gate line and the erasing gate line comprises:
controlling the pull down control signal to be approximately 0 V;
applying a voltage of approximately 0 V to the bit line coupled to the selected flash memory cell;
applying a voltage of approximately 0 V to the word line coupled to the selected flash memory cell;
applying a voltage of approximately 0 V to the control gate line coupled to the selected flash memory cell; and
applying a voltage in a range of approximately 11 V-12 V to the erasing gate line coupled to the selected flash memory cell.

20. The method according to claim 19, wherein:
the voltage applied to the erasing gate line coupled to the selected flash memory cell is approximately 11.5 V.

* * * * *